United States Patent [19]

Ishino

[11] 4,107,547
[45] Aug. 15, 1978

[54] LOGIC CIRCUIT FOR A SEMICONDUCTOR INTEGRATED CIRCUIT

[75] Inventor: Hiroshi Ishino, Tokyo, Japan

[73] Assignee: Oki Electric Industry Co., Ltd., Tokyo, Japan

[21] Appl. No.: 694,921

[22] Filed: Jun. 11, 1976

[30] Foreign Application Priority Data

Jun. 23, 1975 [JP] Japan ............................... 50-75449
Oct. 7, 1975 [JP] Japan ............................... 50-120289
Oct. 7, 1975 [JP] Japan ............................... 50-120290

[51] Int. Cl.² ............... H03K 19/12; H03K 19/08
[52] U.S. Cl. .................................. 307/203; 307/213; 307/214; 307/215; 307/218
[58] Field of Search ............... 307/213–215, 307/218, 207, 303, 208, 317 A

[56] References Cited

U.S. PATENT DOCUMENTS 3,962,590  6/1976  Kane et al. ............... 307/214

*Primary Examiner*—John Zazworsky

*Attorney, Agent, or Firm*—Kenyon & Kenyon

[57] ABSTRACT

The present invention relates to a logic circuit consisting of an improved basic logic circuit which permits a wired logic operation and is suitable for constructing a large-scale integrated circuit (LSI). In most of the conventional basic logic circuits, because the output current is bi-directional, it is impossible to carry out the wire logic operation. In the improved basic logic circuit, since the output current is uni-directional, the only requirement is that the outputs of the plural basic logic circuits be connected with each other for carrying out the output wired-OR logic and the output wired-AND logic operations, so that the logic circuit is composed of a number of basic logic circuits, which number is smaller than the number of the conventional logic circuits. Accordingly, the following advantages can be obtained by utilizing the present invention: an improvement in the IC level of the semi-conductor IC device, a reduction in the cost of manufacturing the device and an increase in the operating speed of the device.

9 Claims, 17 Drawing Figures

Fig. 6

| CASE | BASIC LOGIC CIRCUIT | SYMBOL | SYMBOL WITH ARROW |
|---|---|---|---|
| A | AND | | |
| | NOT (INV) | | |
| B | OR | | |
| | NOT (INV) | | |
| C | AND | | |
| | OR | | |
| | NOT (INV) | | |

LOGIC CIRCUIT FOR A SEMICONDUCTOR INTEGRATED CIRCUIT

BACKGROUND OF THE INVENTION

The present invention relates generally to a bipolar type semiconductor integrated circuit, and more particularly, to a basic logic circuit adoptable in a large scale integrated circuit (LSI) chip.

Example types of output circuit of such conventional circuits are shown in FIGS. 1(A), 1(B) an 1(C). These Figures show such examples, respectively, which all consist of output transistors, resistors and diodes. In these Figures, the symbols Vcc and A,B, . . . denote power source and output terminal, respectively. On the respective output terminals will develop a low-level output voltage (will be referred to as L level or simply as L hereinbelow) or a high level output voltage (will be referred to as H level or simply as H hereinbelow) by turning on or off the output transistor corresponding to the logic operation results. However, in many cases, the current through the output terminal is bi-directional as shown by the arrows. Namely, in case the output voltage is at H level, the current will flow out of the output transistor, while for a L level output voltage, the current will flow into the same output transistor. Because of such bi-directionality, the logic circuit including this type of output circuit cannot function practically to perform the wired logic operation as the outputs are interconnected between them. That is to say, when the outputs are shorted between them, the current will flow from the H output to the L one if one of the outputs is at H level, while the other is at L level. This is not only logically invalid but also will generally cause the failure as the voltage value on the L output is higher than the permissible value.

Since in the recent LSI circuit, it is essential to improve the circuit function and reduce the manufacturing cost by integrating in a small semiconductor chip as many logic composed by basic logic circuits as possible, therefore, it is necessary to simplify the basic logic circuit to the possible degree as well as to minimizze the total number of the basic logic circuits used in a chip. Further interconnection between the outputs as mentioned above will provide means for performing a logic operation, namely, an output logic. For instance, a wired-OR logic may be provided by simply short-circuiting the output terminals between them, which will result in omission of one basic OR gate circuit. This method is optimum in the respect of minimizing the total number of the basic logic circuits as mentioned above. But, because of the reason as set forth in the preceding, such method could not be carried out for the types of output shown in FIGS. 1(A), 1(B) and 1(C).

SUMMARY OF THE INVENTION

The present invention has the main object to eliminate the drawbacks as found in the types of output circuit of the basic logic circuits shown in FIGS. 1(A), 1(B), and 1(C), thus providing a further improved basic logic circuit.

Accordingly, the main feature of the present invention consists in providing an improved basic logic circuit wherein the output current is unified in its flowing direction.

Another feature of the present invention consists in providing an improved basic logic circuit with a higher operation speed.

A further feature of the present invention consists in providing an improved basic logic circuit wherein the power consumption is reduced.

Still another feature of the present invention consists in providing an improved basic logic circuit wherein the circuit is simplified and the space factor is improved.

The above objects are attained according to the present invention, by providing a logic circuit comprising a plurality of basic logic circuits, each of which has a plurality of output terminals each having a uni-directional output current in which the output current flows in a predetermined direction either of "drive" or "sink" in one logic status either of "H" or "L" at the output terminal, while in the other logic status of the output terminal the output current is zero, the output currents being of opposite directions to each other between two output terminals of one basic logic circuit, the output logic status being also of opposite logic status to each other between two output terminals of the basic logic circuit when the output currents are in existence, and the output terminals being directly connected between the basic logic circuits so as to provide a wired logic operation.

BRIEF DESCRIPTION OF THE DRAWINGS

The foregoing and other objects, features and attendant advantages of the invention will become better understood by means of the following description and the accompanying drawings wherein:

FIG. 6 is a table showing the combination of the logic circuits according to the present invention;

DESCRIPTION OF THE PREFERRED EMBODIMENTS

Figure 2A:
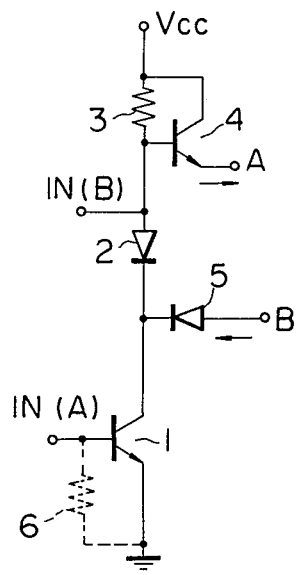
FIGS. 2(A), 2(B), 2(C), 2(D) and 2(E) are five embodiments of the logic circuits according to the present invention.
Figure 2B:
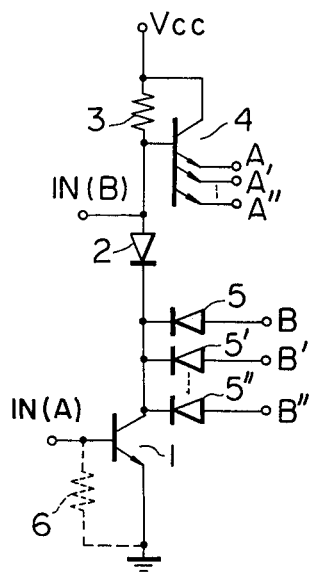
Figure 2C:
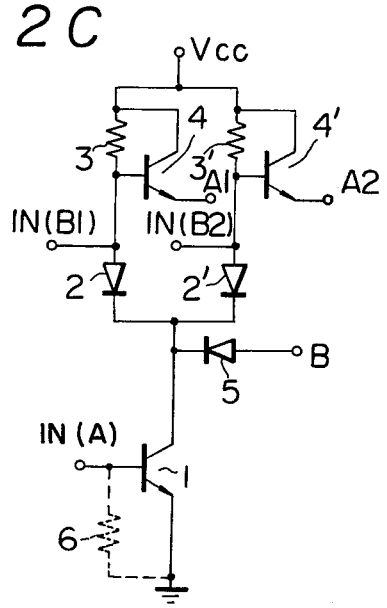
Figure 2D:
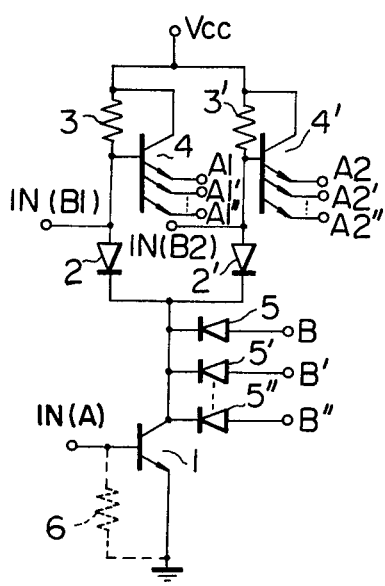
Figure 2E:
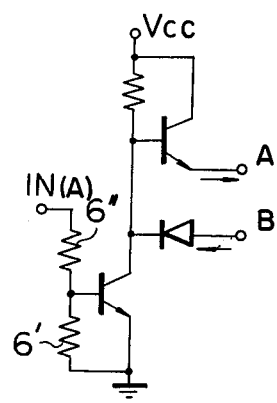

FIGS. 2(A), 2(B), 2(C), 2(D) and 2(E) illustrate basic logic circuits according to the present invention. FIG. 2(A) illustrates a fundamental basic logic circuit according to the present invention. FIGS. 2(B) and 2(D) show example applications with multiple outputs. FIG. 2(C) illustrates an example application with multiple inputs IN (B). FIG. 2(E) is similar to FIG. 2(A) except for the deletion of the diode 2 and the presence of the resistance 6".

Referring now to FIG. 2(A), the collector of an inverter transistor 1 which has the emitter grounded is connected to the cathode of a diode 2 which in turn has the anode of the diode 2 connected to a power source Vcc through a resistor 3, and to the base of an output transistor 4. The collector of the output transistor 4 is connected to the power source Vcc, and the emitter derived from the output transistor 4 serves as the output A of the basic logic circuit. To the collector of the inverter transistor 1 is connected the cathode of an output diode 5, the anode of which serves as an output B. Further, the bases of the transistors 1 and 4 are used as input terminals (IN (A), IN (B), respectively).

The basic logic circuit according to the present invention operates as follows.

When the status of the input of the inverter transistor 1 is at an "L" level, in which case the transistor 1 is in a cutoff condition, the base voltage of the output transistor 4 will be increased. Therefore, the output terminal A will be in such a condition that the output current can flow outward through the emitter of the output transistor 4. On the other hand, when the status of the input of said inverter transistor 1 is at an "H" level, in which case the transistor 1 is in a conductive condition, the base voltage of the output transistor 4 will be decreased. Therefore, the output terminal A will be in such a condition that a current will not be able to flow outward from the emitter of the output transistor 4.

Further, when the status of the input of the inverter transistor 1 is at an "L" level, in which case the transistor 1 is off, the cathode voltage of the output diode 5 will be increased, and the output diode 5 will be turned off. Therefore, the current will not be able to flow into the output terminal B. On the other hand, when the status of the input of the inverter transistor 1 is at an "H" level, in which case the transistor 1 is on, the cathode voltage of the output diode 5 will be decreased. Therefore, the output terminal B will be in such a condition that the terminal B can sink the load current through the output diode 5.

From the above explanation, it will be understood that the output currents at the output terminals A and B are uni-directional, the directions of the currents being opposite to each other as shown in FIG. 2A by the arrows.

Also, each logic status in which the output current flows in the respective terminals A and B is opposite to each other. The output current of the terminals A and B occur alternately depending on the logical input status of the basic logic circuit.

Figure 3A:
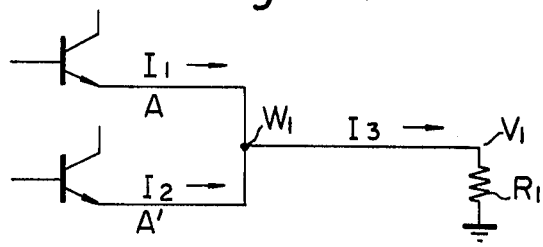
FIGS. 3(A) and 3(B) are diagrams for the explanation of the operation of the present invention.
Figure 3B:
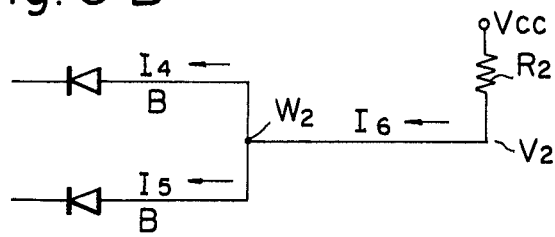

Thus, when the output A is interconnected to the output A′ of another basic logic circuit, a wired −OR logic may be established. This is illustrated in FIG. 3(A) in which the two outputs A and A′ are connected as short-circuited at the point $W_1$. Consequently, when either of the current $I_1$ or $I_2$, or both of them flows an output current $I_3(=I_1+I_2)$ will occur, which makes the voltage $V_1$ developed across the load resistance $R_1$ be at H level, which shows that the wired-OR logic is carried out just at the point $W_1$. Similarly, when the output B is interconnected with the output B′ of another basic logic circuit, a wired-AND logic may be established. This is shown in FIG. 3(B) where the two outputs B and B′ are connected as short-circuited at the point $W_2$. As a result, an output current $I_6(=I_4+I_5)$ will not occur only when both the currents $I_4$ and $I_5$ are not flowing which causes the voltage $V_2$ to be at a logic H level. From the above description, it will be understood that the wired-AND logic is carried out just at point $W_2$.

The output $V_1$ implemented with the wired-OR operation as mentioned above is connected to the input IN (A) of another identical basic logic circuit. At this time, the current from the output A (outflow current) will be directly a base drive current component for the other input IN (A). This current component should be determined to be constant when designing the basic logic circuit from the viewpoint of the power consumption and arithmetic operation speed of a device including the logic circuit, as a whole. Accordingly, the power source Vcc should be supplied by a constant current source so as to be in accordance with the constant current component.

As a matter of fact, the current consumed by a logic circuit is generally proportional to the power dissipation of a device including the logic circuit, but in reversed proportion with the propagation delay time of a basic circuit. So, the operation mode may be selected for a desired power or speed by adjusting the power current value before designing the device. From this, it follows that a circuit designer can choose the operating current of the circuit so as to satisfy the given electric specification.

On the other hand, the output $V_2$ implemented with the wired-AND operation will be interconnected to the input IN (B) of another identical basic logic circuit. Then, at the input IN (B), the incoming input signal and the signal at the collector of said inverter transistor 1 performs wired-AND logic. The result will appear at the output A. The diode 2 is necessary for carrying out the wired-AND logic. That is to say, when the same output signal as that at the output B with the uni-directed output current from the output diode 5 occurs at the anode of the diode 2, the output signal and the incoming signal at the input IN (B) will perform the wired-AND logic, according to the principle shown in FIG. 3(B).

In connecting between outputs, one output A should be connected to the same type of "A" output, and one output B should be connected to the same type of "B" output. If one output A is connected to another type of output B, these connecting basic logic circuits will not be able to carry out the wired logic operation.

In the case of designing a logic circuit, the capability of multiple fan-outs and/or multiple inputs is often required. Shown in FIGS. 2(B), 2(C) and 2(D) are modified examples of FIG. 2(A) by which the above-mentioned requirement can be attained.

The basic logic circuit shown in FIG. 2(B) is different from the basic logic circuit shown in FIG. 2(A) in that a multiple emitter transistor is used instead of an output transistor 4, and cathodes of a plurality of the output diodes 5, 5′, 5″, ... are connected to the collector of the inverter transistor 1. Each emitter of the multiple emitter output transistor is connected to the output terminals A, A′, A″, ..., respectively, and each anode of the output diodes is connected to the output terminals B, B′, B″, ..., respectively. Thus, the same output signals can be obtained at the output terminals A, A′, A″, ..., and it is possible to carry out the wired-OR logic operation independently between the A-type outputs of other basic logic circuits. Also, the same output signals can be obtained at the output terminals B, B′, B″, ..., and it is possible to carry out the wired-AND logic operation independently between the B-type outputs of other basic logic circuits.

The basic logic circuit shown in FIG. 2(C) is different from the basic logic circuit shown in FIG. 2(A) in that a plurality of the circuits, each of which consisting of an input terminal IN(B), an output terminal A, a diode 2, a resistor 3 and a transistor 4, are connected between the collector of the inverter transistor 1 and the power source Vcc, in parallel. Therefore, at each input terminal IN($B_1$), IN($B_2$), ..., the wired-AND logic operation can be carried out, respectively, by the incoming input signal and the signal from the collector of the inverter transistor 1. The result of the operation can be derived from each emitter of the output transistors 4, 4', . . . .

The basic logic circuit shown in FIG. 2(D) is different from the basic logic circuit shown in FIG. 2(C) in that multiple emitter transistors are used instead of output transistors 4, 4', . . . , and cathodes of a plurality of output diodes 5, 5', 5", . . . are connected to the collector of the inverter transistor 1. Namely, the basic logic circuit shown in FIG. 2(D) is the circuit which is constructed by combining the circuits shown in FIGS. 2(B) and 2(C). This basic logic circuit has many output terminals for carrying out the wired-OR operation and the wired-AND operation. As a result of which, this basic logic circuit can be used for more diversified purposes.

Another modified example of FIG. 2(A) is shown in FIG. 2(E). The feature of this basic logic circuit resides in that the input terminal IN(B) and the diode 2 are omitted, and two resistors 6' and 6" are inserted to input terminal IN(A). The resistor 6' as well as the resistor 6 shown in FIG. 2(A) provides a good turn off drive for the inverter transistor 1. The resistor 6" is an input current limiting resistor, and the resistor 6" serves to increase the input threshold voltage $V_T$, to a value higher than the base emitter forward voltage $V_{BE}$, according to the following equation.

$$V_T = V_{BE}(1 + \frac{R_{6''}}{R_{6'}})$$

Therefore, the noise margin is increased.

The resistor 6 shown by broken lines in FIGS. 2(A), 2(B), 2(C) and 2(D) forms a discharge circuit mainly of the charge on the base of the inverter transistor 1. The resistor 6 is not essential for the fundamental effect of the present invention. Moreover, the inverter transistors and diodes shown throughout the figures above may be replaced with Shottky-clamp transistors and Shottky diodes, to provide a higher operational speed of the logic circuit.

Figure 4A:
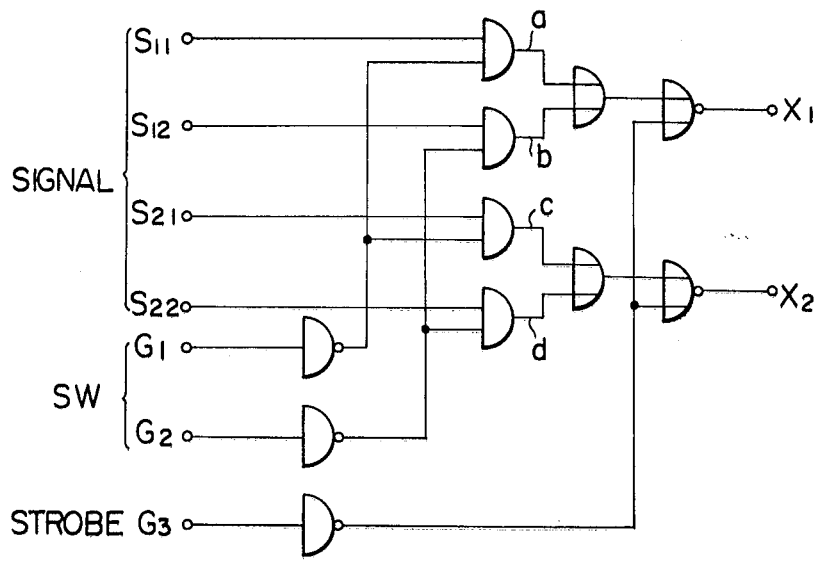
FIG. 4(A) shows a block diagram for a signal switching circuit.
Figure 4:
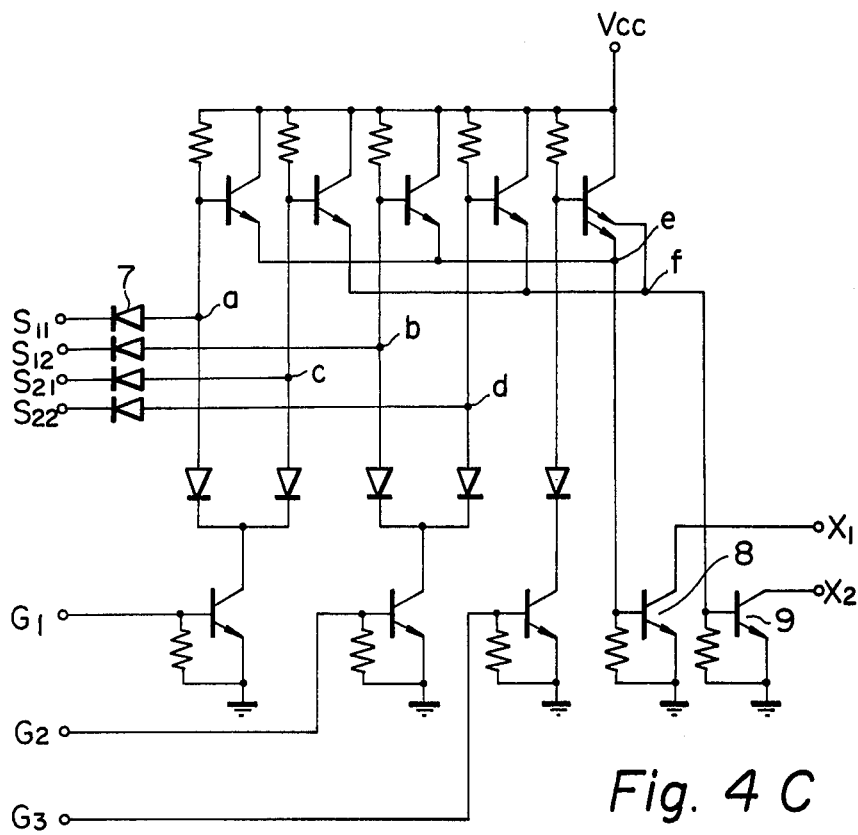
FIG. 4(B) is the equivalent circuit of FIG. 4(A)
FIG. 4(C) is an input circuit needed in the embodiment of FIG. 2(E)
Figure 4:
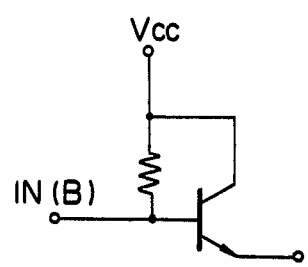
Figure 5:
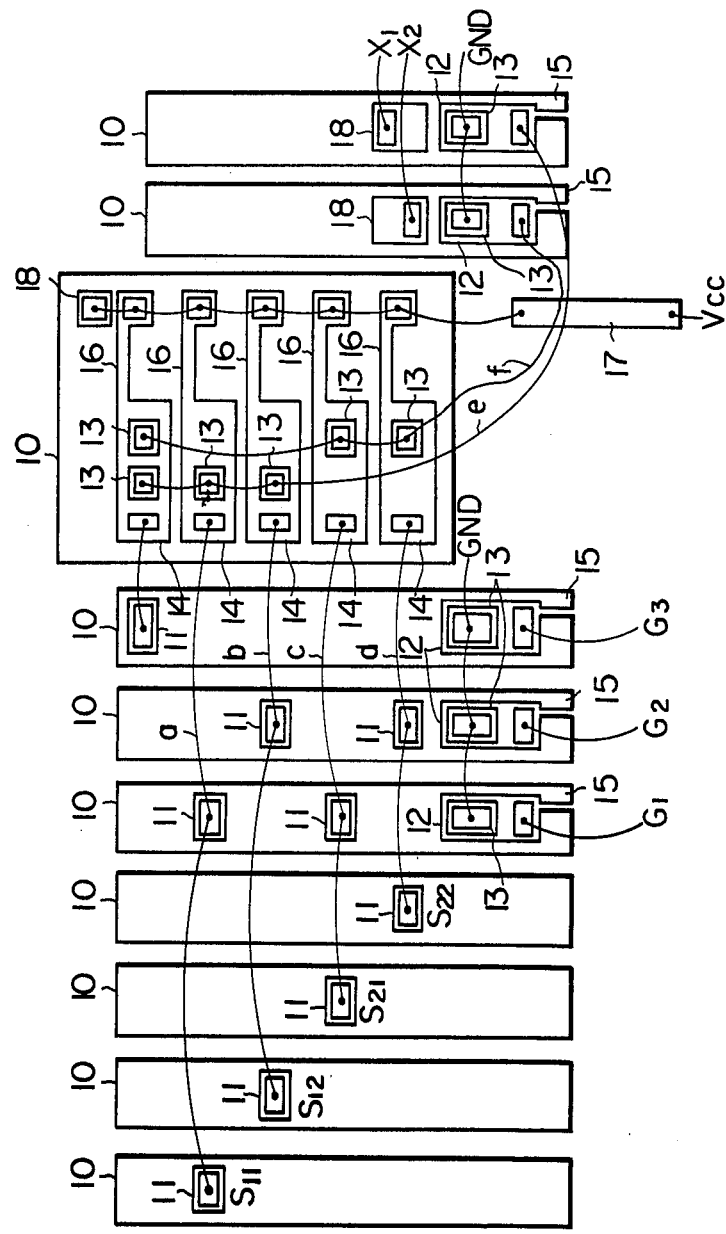
FIG. 5 is an embodiment of the integrated circuit of FIG. 4(B)

Now, embodiments according to the application (FIG. 2(D)) are illustrated in FIGS. 4(A), 4(B) and 5. FIG. 4(A) shows a block diagram for a signal switching circuit. FIG. 4(B) shows an equivalent circuit of that in FIG. 4(A). The points $a$, $b$, $c$ and $d$ in FIG. 4(B) correspond to the inputs IN (B) in FIGS. 2(A), 2(B), 2(C) and 2(D). At these points signals $S_{11}$, $S_{12}$, $S_{21}$ and $S_{22}$, and inversed signals of gate signals $G_1$ and $G_2$ compose the wired-AND logic. Further, such points in FIG. 4(B) correspond to those in FIG. 4(A). A group of four diodes 7 at the inlets of signals $S_{11}$, $S_{12}$, $S_{21}$ and $S_{22}$ are practically involved in the basic logic circuit which delivers at its outputs the signals $S_{11}$, $S_{12}$, $S_{21}$ and $S_{22}$. Those diodes are the same as the diodes 5 in FIGS. 2(A), 2(B), 2(C) and 2(D). At the points $e$ and $f$ shown in FIG. 4(B), respectively, the signals at the points $a$ and $b$, and the inversed signal of the strobe (gate) signal $g_3$ compose the wired-OR logic, and the signals at the points $c$ and $d$, and the inversed signal of the strobe (gate) signal $G_3$ compose the wired-OR logic. Those signals will further be inversed through the transistors 8 and 9 to provide output signals $X_1$ and $X_2$.

FIG. 5 shows a preferred embodiment wherein the logic circuits as in FIG. 4(B) are integrated in a semiconductor substrate chip. It will be evident to those skilled in the art that with this embodiment, a significant effect may be provided when the logic circuits according to the present invention are adopted especially in a large-scale integrated circuit.

Referring now to FIG. 5, the transistors and diodes are fabricated in the respective regions 10 separated like islands which have an N type conduction area, by using the diffusion process, etc. in the field of the semiconductor technique. Those regions include P type diffused layers for diode 11 containing a contact section, P type diffused layers 12 for a base containing a contact section, N+ type diffused layers 13 for an emitter containing a contact section, P-type diffused layers 14 for a base containing the contact section made in an N-type power source region, resistor sections 15 and 16, an element 17 for tunnel wiring, and N+ diffused layers 18 for a collector containing a contact section. In FIG. 5, the electric connections among each element are simply illustrated by lines. However, practically, those lines should be formed by evaporated metallic film such as aluminum film, etc. Further, each line of $a$, $b$, $c$, $d$, $e$ and $f$ correspond to those signals $a$, $b$, $c$, $d$, $e$ and $f$ in FIG. 4(B). The lines $a$, $b$, $c$ and $d$ interconnect externally the diodes 11 in the respective transistor region, for wired-AND logic. The connections $e$ and $f$ interconnect externally the emitter outputs 13 of the respective transistors, for wired-OR logic. According to this embodiment, the island regions required to form an entire circuit are ten in number. On the contrary, as many as 20 island regions in number are needed for a conventional TTL logic circuit.

FIG. 6 lists the combinations of basic logic circuits possible of forming a logic circuit (Cases A, B and C) and their associated logic symbols, and further logic symbols with additional indication of the current's unidirectionality. Generally, a logic circuit may be formed by the combination of Case A, namely, with at least an AND and NOT (or INV) basic logic circuit. Further, the combination Case B may be used to form a logic circuit. However in many cases, it is more advantageous in the light of the Theorem of De Morgan to form a logic circuit with three kinds of basic logic circuits such as AND, OR and NOT (or INV) as implied by the Case C rather than to make it with only two kinds of basic logic circuits as in the Case A or B. Namely, the Case C can reduce the number of required basic logic circuits per logic circuit.

Figure 7:
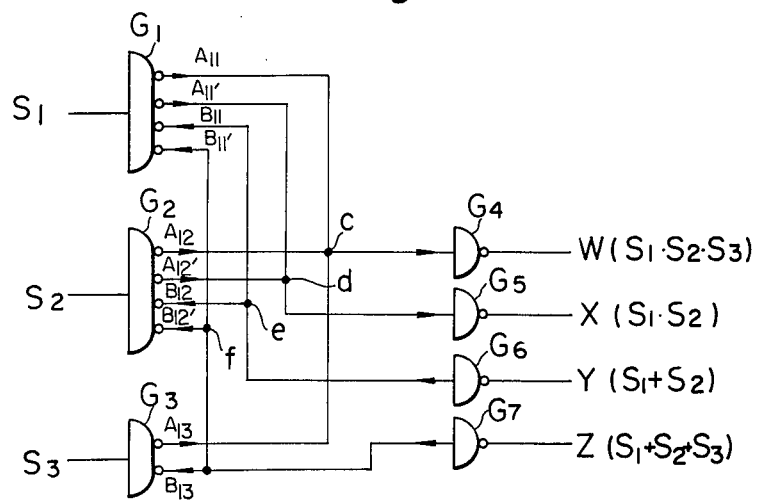
FIG. 7 is a logic diagram of the other embodiment of the present invention.

FIG. 7 shows an embodiment of a logic circuit according to Case C of FIG. 6. In FIG. 7, inverters $G_1$ and $G_2$ correspond to the basic logic circuit shown in FIG. 2(B), and inverter $G_3$ corresponds to the basic logic circuit shown in FIG. 2(A). The gates designated by reference FIGS. $G_4$, $G_5$, $G_6$ and $G_7$ are inverters which are required for logical conversion, respectively.

In FIG. 7, four logic signals W, X, Y and Z are delivered as the output result of the product or sum of three input signals $S_1$, $S_2$ and $S_3$. One of said output signals W is the AND of input signals $S_1$, $S_2$ and $S_3$. Namely, the input signals $S_1$, $S_2$ and $S_3$ are inverted through the basic logic circuits $G_1$, $G_2$ and $G_3$, respectively. The output signals ($A_{11}$, $A_{12}$ and $A_{13}$, respectively) from the basic logic circuits are wired for OR logic by interconnecting the outputs at the point $c$. The OR output signal is inverted again through the basic logic circuit $G_4$ where the signal will be the AND output resulted from said input signals $S_1$, $S_2$ and $S_3$. The output signal X is the AND of the input signals $S_1$ and $S_2$. These input signals are inverted through the basic logic circuits $G_1$ and $G_2$, respectively. The output signals ($A_{11}$, and $A_{12}$, respectively) from the basic logic circuits are wired for OR logic by interconnecting the outputs at the point $d$. The OR output signal thus obtained will be inverted again through the basic logic circuit $G_5$. In this way, the input signals $S_1$ and $S_2$ will be delivered as an AND output. Further, the output signal Y is the OR of the input signals $S_1$ and $S_2$. The input signals $S_1$ and $S_2$ are inverted through the basic logic circuits $G_1$ and $G_2$, respectively. The output signals ($B_{11}$ and $B_{12}$, respectively) from the circuits will be wired for AND logic by interconnecting the outputs at the point $e$. The AND output signal is further inverted through the basic logic circuit $G_6$. Thus, the input signals $S_1$ and $S_2$ will be an OR output. Finally, the output signal Z is the OR of the input signals $S_1$, $S_2$ and $S_3$. Namely, the signals $S_1$, $S_2$ and $S_3$ are inverted through the basic logic circuits $G_1$, $G_2$ and $G_3$, respectively. The output signals ($B_{11}$, $B_{12}$, and $B_{13}$, respectively) from the basic logic circuits are wired for AND logic by interconnecting the outputs at the point $f$. The AND output signal will be further inverted through the basic logic circuit $G_7$. As the result, said input signals $S_1$, $S_2$ and $S_3$ will be delivered as an OR output. The logic conversion of these signals is based on the Theorem of De Morgan.

Figure 1A:
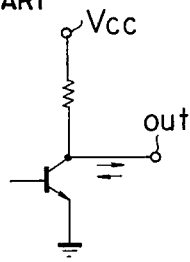
FIGS. 1(A), 1(B) and 1(C) are three examples of a prior logic circuit.
Figure 1B:
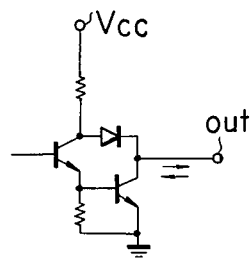
Figure 1C:
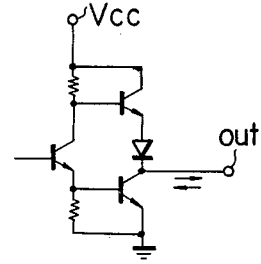
Figure 8:
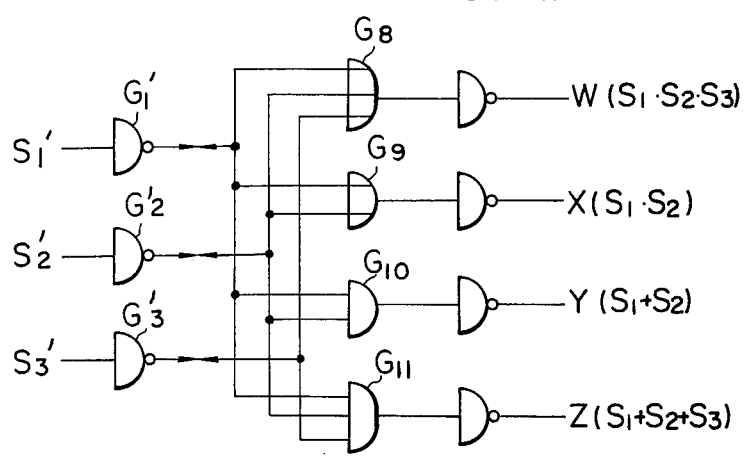
FIG. 8 is the prior equivalent circuit of FIG. 7.

As seen from FIG. 7 and in the foregoing, it will be obvious that the logic circuit according to the present invention can be considerably simplified. A conventional logic circuit will be illustrated in FIG. 8, as an equivalent circuit of that in FIG. 7. Since the respective basic logic circuits $G'_1$, $G'_2$ and $G'_3$ included in the conventional logic circuit have the current flowing bidirectionally at their outputs as shown by the arrows in FIGS. 1(A), 1(B) and 1(C), the basic logic circuits $G_8$, $G_9$, $G_{10}$ and $G_{11}$ are absolutely necessary in order to provide the AND or OR outputs of input signals $S'_1$, $S'_2$ and $S'_3$. This will be an obstacle against a larger-scale integration especially of a digital integrated circuit. With one of the embodiments according to the present invention, shown in FIG. 7, the currents through the output stages of basic logic circuits $G_1$, $G_2$ and $G_3$ are unified in their flowing direction, and AND or OR output may be provided by simply interconnecting the output terminals. The number of basic logic circuits forming a logic circuit is considerably reduced, the integration scale is expanded and such logic circuit may be produced with lower cost.

As seen in the foregoing, the logic circuits according to the present invention provides the advantages as mentioned below:

The output current of the improved basic logic circuit according to the invention is unified in its flowing direction, so that the output wired-OR logic and the output wired-AND logic can be realized by interconnecting the outputs of the basic logic circuits.

When an integrated circuit is designed by using this improved basic logic circuit, in which logic operation can be carried out by interconnecting the output terminals among them, the isolation regions required in the integrated circuit can be reduced. As a result, many basic logic circuits can be arranged in a small chip area. Therefore, this basic logic circuit according to this invention is suitable for obtaining a large-scale integrated circuit which has a high density and is not expensive.

Since using the output wired logic helps to reduce the number of gate stages, the improved basic logic circuit serves to increase the operational speed.

Carrying out the output wired logic helps to reduce the number of gate stages. As a result, the total power consumption of the circuit is reduced. Therefore, it is possible to design a lower power consumption circuit.

Since the improved basic logic circuit can be supplied with a constant current source in designing the logic circuit, it is possible to select the value of the consumption current according to the desired operational speed.

The basic logic circuit can be fabricated by using an established process for manufacturing bipolar semiconductor. As a result, it is possible to fabricate the present invention together with the TTL integrated circuit and or the analog integrated circuit on the same semiconductor substrate.

Another feature of the basic logic circuit is that an effective pattern layout of an integrated circuit can be realized, since the inputs/outputs of the circuit can be arranged to intersect perpendicularly with the wiring channels.

What is claimed is:

1. A basic logic circuit, wherein the collector of a first transistor which has an emitter which is connected to ground is connected to the base of a second transistor having at least one emitter and to the power source through a resistance component, the base of said first transistor is connected to an input terminal as well as to ground through a first resistor, the collector of said second transistor is connected to said power source, each of said emitters of said second transistor provides a first output signal, while to the collector of said first transistor is connected the cathode of at least one diode, and each of the anodes of said diodes provides a second output signal.

2. A basic logic circuit according to claim 1, wherein first transistor is a Schottky-clamp transistor, and said diode or diodes are Schottky diode, respectively.

3. A basic logic circuit according to claim 1, wherein a second resistor is inserted between the base of said first transistor and said input terminal.

4. A basic logic circuit according to claim 3, wherein said first transistor is a Schottky-clamp transistor, and said diode or diodes are Schottky diodes, respectively.

5. A basic logic circuit, wherein the collector of a first transistor which has an emitter which is connected to ground is connected to the cathode of a first diode which has an anode connected to the base of a second transistor having at least one emitter, to a first input terminal and to a power source through a resistance component, the base of said first transistor is connected to a second input terminal as well as to ground through a resistor, the collector of said second transistor is connected to the power source, each of said emitters of said second transistor provides a first output signal, while the cathode of at least one additional diode is connected to the collector of said first transistor and each of the anodes of said additional diodes provides a second output signal.

6. A basic logic circuit according to claim 5, wherein said first transistor is a Schottky-clamp transistor, and said diode or diodes are Schottky diodes, respectively.

7. A basic logic circuit, wherein the collector of a first transistor which has an emitter which is connected to ground is connected to each of the cathodes of a first group of diodes, each of said first group of diodes having an anode connected to the base of a different one of a number of second transistors each of which having at least one emitter, to a different one of a number of independent first input terminals and a different one of a number of resistance components each of which is connected to a power source; the base of said first transistor is connected to a second input terminal and to ground through a resistor, the collectors of said second transistors are connected to the power source; each of the emitters of said second transistors provides a first output signal; while the collector of said first transistor is connected to the cathodes of a second group of diodes; and each of the anodes of said second group of diodes provides a second output signal.

8. A basic logic circuit according to claim 7, wherein said first transistor is a Schottky-clamp transistor, and said diode or diodes are Schottky diodes, respectively.

9. A logic circuit comprising:
a plurality of basic logic circuit means, each of said logic circuit means:
including a plurality of output terminals and an input terminal, said input terminal being adapted to be responsive to an input signal having first and second logic levels associated with first and second logic states, respectively, of that logic circuit;
and providing a uni-directional current flow through a first one of said output terminals and a zero current flow through a second one of said output terminals in response to one of said first and second levels of said input signal and a uni-directional current flow through said second one of said output terminals and a zero current flow through said first one of said output terminals in response to the other level of said input signal, said uni-directional current flow through said first and second ones of said output terminals being one of sink and drive and said uni-directional current flow through said first one of said one output terminals being opposite said uni-directional current flow through said second one of said output terminals;
means for directly connecting said first one of said output terminals of one of said plurality of logic circuit means to said first one of said output terminals of another one of said logic circuit means;
and means for directly connecting said second one of said output terminals of said one of said plurality of logic circuit means to said second one of said output terminals of another one of said logic circuit means.

* * * * *

UNITED STATES PATENT AND TRADEMARK OFFICE
CERTIFICATE OF CORRECTION

PATENT NO. : 4,107,547
DATED : August 15, 1978
INVENTOR(S) : Hiroshi Ishino

It is certified that error appears in the above-identified patent and that said Letters Patent are hereby corrected as shown below:

Col. 5, line 43, after "(FIG. 2(D)" delete second parenthesis.

Col. 6, line 20, change "correspond" to --corresponds--.

Signed and Sealed this

Seventeenth Day of April 1979

[SEAL]

Attest:

RUTH C. MASON
Attesting Officer

DONALD W. BANNER
Commissioner of Patents and Trademarks